United States Patent [19]

Cooper et al.

[11] Patent Number: 5,158,910
[45] Date of Patent: * Oct. 27, 1992

[54] PROCESS FOR FORMING A CONTACT STRUCTURE

[75] Inventors: Kent J. Cooper; Michael P. Woo; Wayne J. Ray, all of Austin, Tex.

[73] Assignee: Motorola Inc., Schaumburg, Ill.

[*] Notice: The portion of the term of this patent subsequent to Mar. 5, 2008 has been disclaimed.

[21] Appl. No.: 618,204

[22] Filed: Nov. 26, 1990

Related U.S. Application Data

[63] Continuation-in-part of Ser. No. 566,185, Aug. 13, 1990, Pat. No. 4,997,790.

[51] Int. Cl.$^5$ .......................................... H01L 21/44
[52] U.S. Cl. .................... 437/195; 437/228; 437/978; 148/DIG. 106
[58] Field of Search ............... 437/195, 228; 148/DIG. 106

[56] References Cited

U.S. PATENT DOCUMENTS

| | | | |
|---|---|---|---|
| 4,868,138 | 9/1989 | Chan et al. | 437/195 |
| 4,883,767 | 11/1989 | Gray et al. | 437/228 |
| 4,997,790 | 3/1991 | Woo et al. | 437/195 |
| 5,024,971 | 6/1991 | Baker et al. | 437/228 |
| 5,037,777 | 8/1991 | Mele et al. | 437/195 |

Primary Examiner—Brian E. Hearn
Assistant Examiner—Laura M. Holtzman
Attorney, Agent, or Firm—Patricia S. Goddard

[57] ABSTRACT

Self-aligned and/or isolated contacts are formed in a semiconductor device, while simultaneously providing device planarization. In one form, an imagable material is deposited directly on a substrate material. The imagable material is patterned to form a sacrificial plug on a portion of the substrate material. A substantially planar insulating layer is then deposited overlying the substrate material. The plug formed of the imagable material is then removed, thereby exposing a portion of the substrate material and defining a contact opening. A conductive layer is deposited and patterned to complete formation of a contact.

21 Claims, 2 Drawing Sheets

PROCESS FOR FORMING A CONTACT STRUCTURE

This application is a continuation-in-part of the commonly assigned U.S. Pat. No. 4,997,790, issued Mar. 5, 1991, entitled, "Process for Forming a Self-Aligned Contact Structure," by Woo et al., Ser. No. 07/566,185, filed Aug. 13, 1990.

TECHNICAL FIELD OF THE INVENTION

This invention relates to semiconductor fabrication processes in general, and more specifically to a process for forming contacts in multi-layer semiconductor devices.

BACKGROUND OF THE INVENTION

Semiconductor product manufactures must continually improve the power and performance of semiconductor devices while keeping the device size to a minimum. A common way to achieve a smaller device is to simply reduce device dimensions. Another widely practiced method of keeping the semiconductor device size to a minimum is achieved by designing and fabricating devices having multiple conductive layers. This is apparent in double-level and triple-level polysilicon and metallization processes.

Manufacturing difficulties have arisen with these complex processes. For example, with smaller and smaller geometries, alignment tolerances in photolithography operations have been significantly reduced. Another difficulty with fabricating multi-layer devices is that of planarizing the various layers. Several known planarization techniques and disadvantages with the techniques are described in the background of U.S. Pat. No. 5,037,777, issued Aug. 6, 1991, filed Jul. 2, 1990, by Mele et al., entitled, "Method for Forming A Multi-Layer Semiconductor Device Using Selective Planarization," and assigned to the assignee hereof. The patent by Mele et al. teaches a method for selectively planarizing a semiconductor device, in other words, how to planarize only areas of the device in which contacts are not to be formed. With the selective planarization process disclosed in the Mele et al., a self-aligned contact is formed and the device is planarized without having to etch overly thick insulating layers.

Another common semiconductor device fabrication problem is the guaranteeing of electrical isolation of a self-aligned contact from underlying conductive members. While etching an insulating layer of the device, sidewall spacers are often formed along conductive members to provide electrical isolation. However, in order to completely etch the insulating material from an area in which a contact is to be formed, the integrity of the sidewall spacers is typically difficult to maintain during the etch process. Sidewall spacers are also attacked during subsequent cleaning steps. Without adequate isolation, the conductive members may be electrically shorted to other conductive members, for instance a contact, possibly causing the device to fail.

BRIEF SUMMARY OF THE INVENTION

The previously discussed problems are overcome and further advantages are achieved with the present invention, in which a contact is formed in a multi-layer semiconductor device using a sacrificial plug. In one form, an imagable material is deposited directly on a substrate material. The imagable material is lithographically patterned to form a sacrificial structure on a first portion of the substrate material while leaving a second portion of the substrate material exposed. An insulating layer is formed overlying the second portion of the substrate material, exposing a portion of the sacrificial structure. The sacrificial structure is removed to expose the first portion of the substrate material. A conductive layer is deposited and patterned to form a contact to the exposed first portion of the substrate material.

DETAIL DESCRIPTION OF A PREFERRED EMBODIMENT

As indicated above, forming a contact in a multi-layered semiconductor device is becoming increasingly difficult with circuits of smaller and smaller dimensions. Some of the problems associated with forming such contacts include reduced photolithography alignment tolerances associated with reduced dimensions, planarization of intermediate layers, and isolation of the contact from underlying conductive layers. A process for forming a self-aligned contact which addresses these problems is disclosed in the above-referenced, commonly assigned U.S. Pat. No. 4,997,790, issued Mar. 5, 1991, entitled, "Process for Forming a Self-Aligned Contact Structure," by Woo et al., Ser. No. 07/566,185, filed Aug. 13, 1990.

The present invention addresses the previously mentioned problems and, in addition, can be implemented in forming non-self-aligned contacts and in forming contacts after metal layers have been deposited. Although some semiconductor manufacturers are using self-aligned contacts to overcome problems associated with alignment, a large number of semiconductor devices require a contact to be formed in an isolated, or peripheral, region of the device. In isolated regions, there is often no underlying topography with which to self-align a contact. The present invention has an advantage in that it can be used to form both self-aligned and non-self-aligned, or isolated, contacts with one process flow. A second advantage is that because the present invention can be performed at temperatures below 250° C., it can be used after a metal layer has been deposited on a semiconductor device. Processing operations following metal deposition, also referred to as "back-end processes," are usually restricted to temperatures below 400° C. Temperatures much above 400° C. will melt metal layers, such as aluminum, and therefore cannot be used. Thus, some proposed processes for forming contact structures are unsuitable once a metal layer has been deposited. The present invention does not have such a limitation.

Figure 1A:
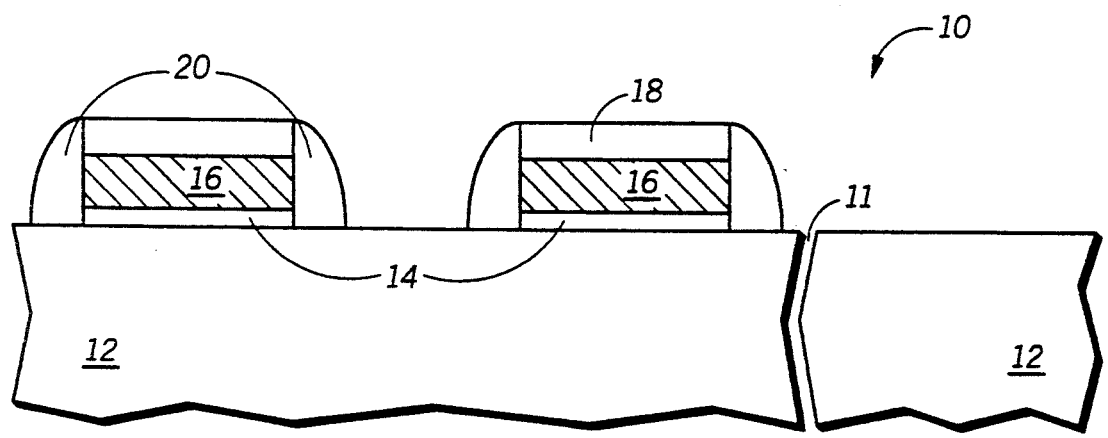
FIGS. 1A-1E are cross-sectional views of a semiconductor device fabrication process for forming a contact in accordance with the present invention.

Illustrated in FIGS. 1A-1E are cross-sectional views which sequentially depict a process for forming a contact in a semiconductor device in accordance with the present invention. FIG. 1A illustrates a semiconductor device 10. The illustration shows a break 11 in semiconductor device 10 in order to illustrate two possible areas of a semiconductor device on which a contact may be formed. In FIGS. 1A-1E, the portion to the left of break 11 illustrates formation of a self-aligned contact, while the portion to the right of break 11 illustrates formation of a non-self-aligned, or an isolated contact. Semiconductor device 10 of FIG. 1A is formed, in part, by a substrate material 12. Substrate material 12 is typically formed of a semiconducting material, such as silicon, however may instead be an intermediate conductive layer within device 10. Overlying substrate material 12, to the left of break 11, are two spaced apart conductive members 16 which are separated from substrate material 12 by an oxide layer 14. Conductive members 16 may be of any conducting material used in the fabrication of semiconductor devices, such as aluminum, an aluminum alloy, polysilicon, tungsten, a refractory metal, or the like. Oxide layer 14 is provided in order to electrically isolate conductive members 16 from substrate material 12 and is often an $SiO_2$ layer, although other dielectric materials are also suitable. Overlying each conductive member is a protective dielectric layer 18. Dielectric layer 18 is used to electrically isolate conductive members 16 from any subsequent conductive material which may be deposited onto semiconductor device 10. To further isolate the conductive members, sidewall spacers 20 are formed on predetermined sides of conductive members 16. Although FIG. 1A illustrates sidewall spacers along each vertical edge of conductive members 16, it is only necessary that spacers be formed on edges which will be proximal to a subsequently formed contact. Materials which are suitable for use as dielectric layer 18, as well as sidewall spacers 24, include $SiO_2$, $Si_3N_4$, and the like. Device 10, as illustrated in FIG. 1A, is fabricated using conventional processes used in the semiconductor industry.

Figure 1B:
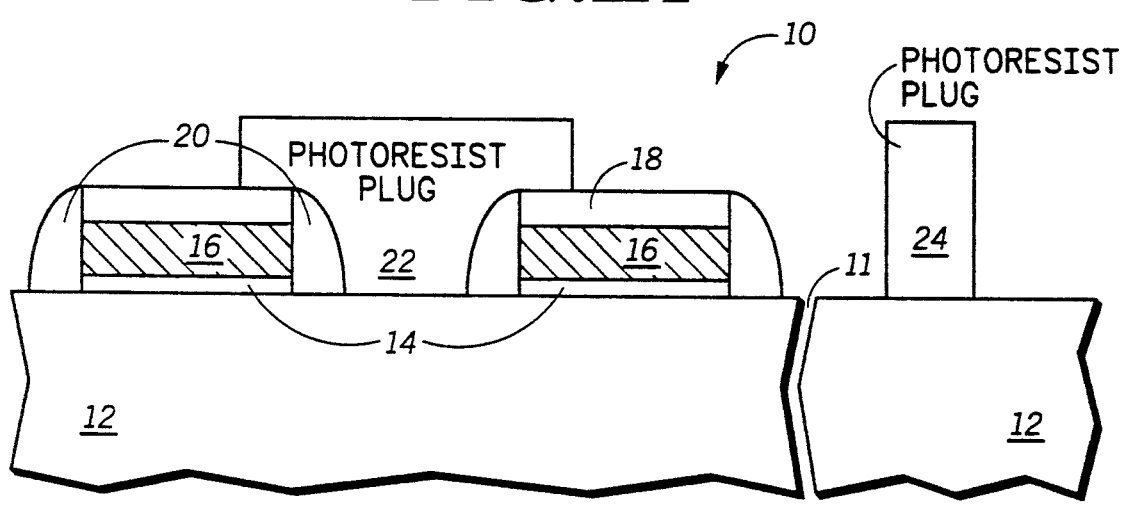

FIGS. 1B-1E illustrate remaining processing steps which are used to form a self-aligned contact or an isolated contact, in accordance with the present invention. As illustrated in FIG. 1B, areas in which contacts are to be formed are defined by using sacrificial plugs. An imagable film (not entirely shown), which can be imaged using actinic radiation, is deposited onto semiconductor device 10. Actinic radiation is radiant energy in the visible and ultraviolet regions of the spectrum which produces chemical changes in a material. With respect to semiconductor device fabrication, actinic radiation includes photolithography, x-ray lithography, and e-beam lithography techniques. With respect to FIG. 1B and FIG. 1C, photoresist is used as the imagable film, although it should be understood that other films are also suitable. As illustrated in FIG. 1B, portions of the photoresist film are directly in contact with the substrate material 12. The photoresist film is patterned to form a sacrificial structure, or plug, for instance photoresist plugs 22 and 24. Depositing and patterning the photoresist film is accomplished through conventional photolithography techniques. Photoresist plug 22 defines an area where a self-aligned contact will be formed between conductive members 16, and photoresist plug 24 defines an area where an isolated contact will be formed. The thickness of the deposited imagable film is not important, although it should be at least the desired thickness of a subsequent insulating layer. The width of each of the plugs is governed by the desired width of a contact, to be formed at a later point.

Figure 1C:
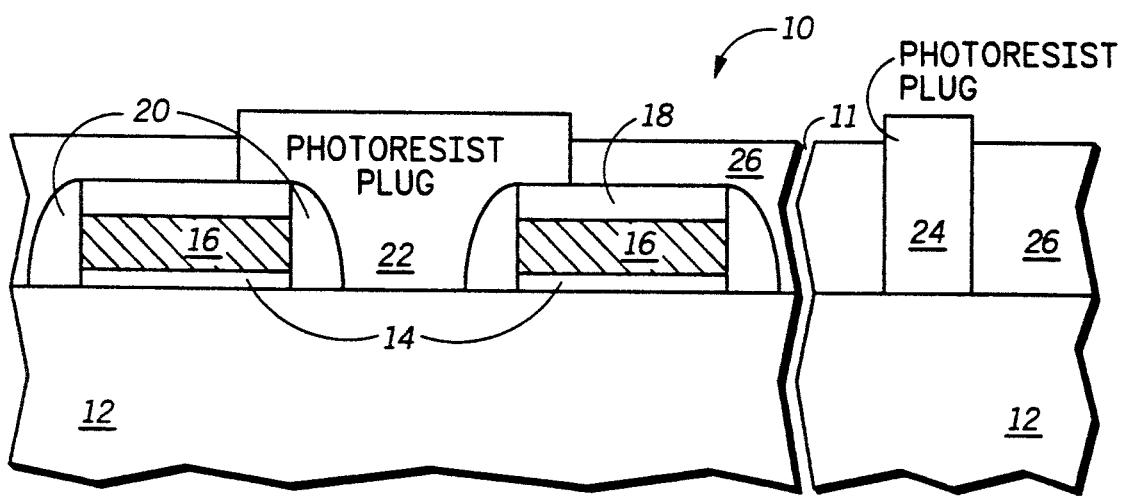

After forming the sacrificial plugs, a first insulating layer 26 is deposited over device 10, as illustrated in FIG. 1C. First insulating layer 26 is illustrated as being discontinuous over device 10, in other words insulating layer does not cover photoresist plugs 22 and 24. The photoresist plugs must be partially exposed so that the plugs can be selectively removed at a later point. There are a few methods in practicing the present invention with which to achieve a discontinuous first insulating layer 26. One method is to deposit a glass insulating layer by ECR (electron cyclotron resonance). Some ECR systems deposit an insulating layer, but require a separate etch operation to expose photoresist plugs 22 and 24. Other ECR systems can deposit an insulating layer and etch the layer in situ with use of a special etch chemistry. With such an ECR system, material deposited on tall features gets removed while material deposited on recessed features remains. Another way to achieve a discontinuous insulating layer is to use a SOG (spin-on-glass) as insulating layer 26. Because SOG is deposited over an the entire device, using SOG also requires etching back the insulating layer to expose the photoresist plugs. Likewise, a PECVD (plasma enhanced chemical vapor deposition) oxide may be used as the insulating layer, but use of a PECVD material requires a subsequent etch to expose the sacrificial plugs. ECR glasses, SOGs, and PECVD oxides provide excellent planarity and each can be etched selectively to most imagable films, including photoresist. It is important to point out that the final thickness of first insulating layer 26 is not important, only that at least a portion of photoresist plugs 22 and 24 are exposed and conductive members 16 are sufficiently isolated.

Figure 1D:
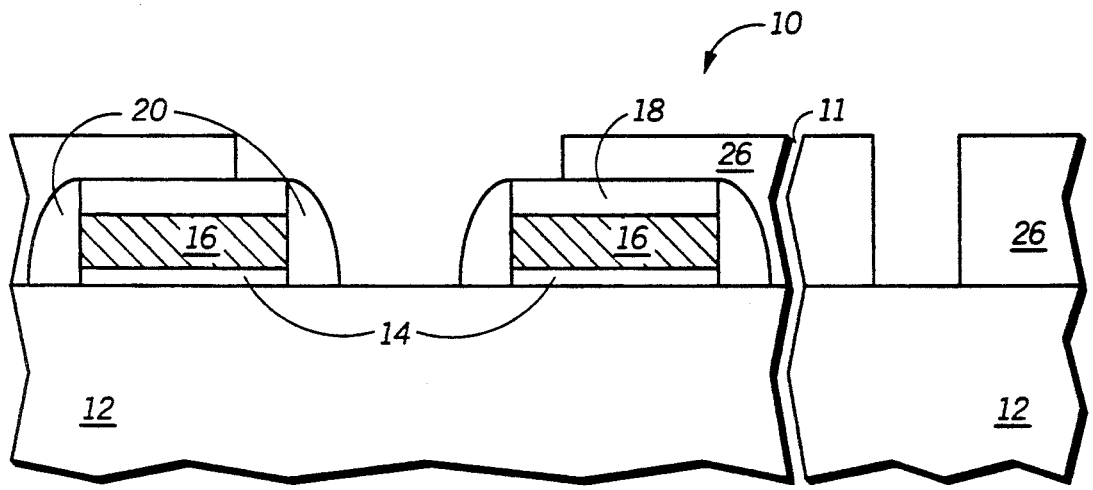
Figure 1E:
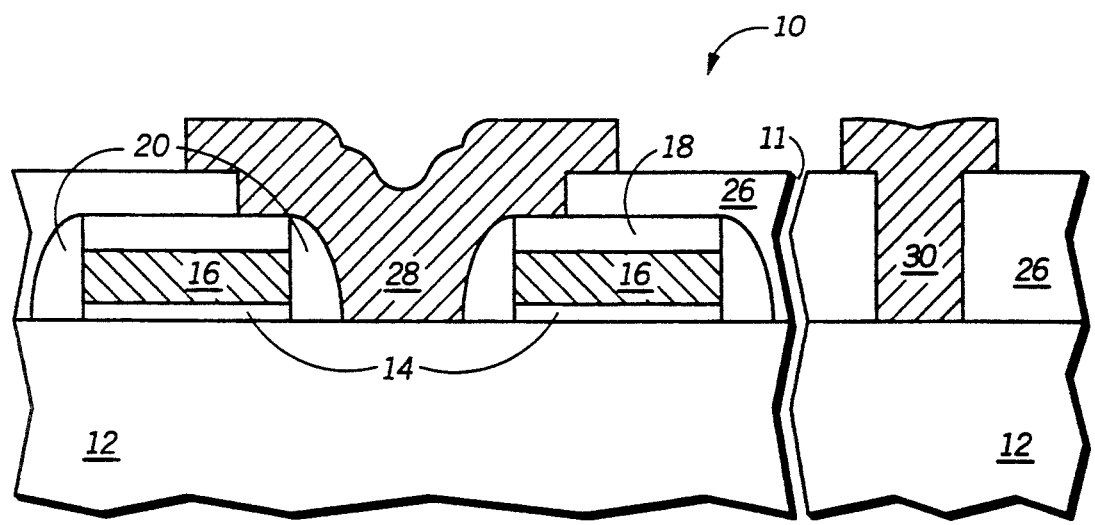

Photoresist plugs 22 and 24 are subsequently removed from device 10. FIG. 1D illustrates that removing the plugs defines a self-aligned contact opening to the left of break 11 and an isolated contact opening to the right of break 11. Photoresist can be selectively etched with respect to insulating layer 26 and underlying substrate material 12 quite easily with, for example, a Piranha etch or an $O_2$ plasma etch. A conductive layer (not entirely shown) is then deposited over device 10. As FIG. 1E illustrates, the conductive layer is patterned to form a self-aligned contact 28 and an isolated contact 30. Conductive materials which are suitable to form contacts 28 and 30 include aluminum, aluminum alloys, polysilicon, tungsten, refractory metals, or the like. If desired, the contacts can be etched back selectively to the underlying layers in order to provide a more planar surface using conventional etching techniques.

The present inventions permits the formation of both self-aligned and isolated contacts with one process which uses a sacrificial plug formed from an actinic radiation imagable material to define contact openings. The use of an imagable material allows the contact formation process to be carried out at temperatures which are suitable for back-end processing. Most imagable materials can be selectively etched very easily to any underlying insulating, conducting, and semiconducting layers. Thus, electrical isolation of contacts from underlying conductive layers is easily maintained. In addition, the present invention can be implemented on devices designed for sub-micron technology due to high resolution capabilities of most imagable materials. It is also possible to use a multi-layer resist process in conjunction with the present invention in order to achieve very small feature sizes. Multi-layer resist processes can provide better resolution because the thickness of the resist layer can be reduced and more uniformly deposited across a wafter.

Thus, it is apparent that there has been provided, in accordance with the present invention, a process for forming a contact structure that fully meets the advantages set forth previously. Although the invention has been described and illustrated with reference to specific embodiments, it is not intended that the invention be limited to these illustrative embodiments. Those skilled in the art will recognize that modifications and variations can be made without departing from the spirit of the invention. For example, use of the invention is not limited to use of photoresist as the imagable material. Other resist materials, for example those used in x-ray and e-beam lithography, may also be used in accordance with the present invention. Nor is the invention limited to forming both a self-aligned and an isolated contact, as illustrated and described. The present invention may be used to form either a self-aligned contact, or an isolated contact, or both. Furthermore, it is not intended that the materials specifically mentioned be the only materials suitable for use in the present invention. Any material which provides the necessary properties of a given layer is suitable. In addition, it is not necessary that a contact be formed to a substrate material which is a semiconductor material. The present invention may be implemented at other levels of a semiconductor device, such as metal interconnect layers. Therefore, it is intended that this invention encompass all such variations and modifications as fall within the scope of the appended claims.

We claim:

1. A process for forming a contact in a multi-layer semiconductor device, comprising the steps of:
   depositing an imagable material directly on a substrate material, the imagable material having the ability to be etched selectively to the substrate material;
   lithographically patterning the imagable material to form a sacrificial structure on a first portion of the substrate material while leaving a second portion of the substrate material exposed;
   forming an insulating layer overlying the second portion of the substrate material and exposing a portion of the sacrificial structure;
   removing the sacrificial structure to expose the first portion of the substrate material while keeping the insulating layer and substrate material substantially unaltered; and
   forming a contact of a conductive material to the exposed first portion of the substrate material.

2. The process of claim 1 wherein the step of depositing an imagable material directly on a substrate material comprises depositing an imagable material directly on a silicon substrate.

3. The process of claim 2 wherein the step of depositing an imagable material comprises depositing a photoresist material.

4. The process of claim 1 wherein the step of forming a contact of a conductive material comprises depositing a conductive layer on the device and patterning the conductive layer to form a contact to the exposed first portion of the substrate material.

5. The process of claim 1 wherein the step of forming an insulating layer comprises forming an insulating layer having a planar upper surface.

6. The process of claim 5 wherein the step of forming an insulating layer comprises depositing an ECR glass.

7. The process of claim 1 wherein the step of forming an insulating layer comprises depositing an insulating layer overlying the substrate material and etching the insulating layer to expose a portion of the sacrificial structure.

8. The process of claim 7 wherein the step of depositing an insulating layer comprises depositing SOG.

9. The process of claim 1 further comprising the step of etching the contact to further planarize the semiconductor device, while leaving the underlying insulating layer substantially unaltered.

10. A process for forming a contact in a multi-layer semiconductor device, comprising the steps of:
    providing a substrate material;
    forming two spaced apart conductive members overlying the substrate material;
    providing a first insulating layer on selected surfaces of the spaced apart conductive members;
    depositing an imagable material overlying the conductive members and the first insulating layer, and directly on a portion of the substrate material located between the two conductive members, the imagable material having the ability to be etched selectively to the first insulating layer and to the substrate material;
    lithographically patterning the imagable material to form a sacrificial plug between the two spaced apart conductive members which is in direct contact with the portion of the substrate material;
    forming a second insulating layer overlying the substrate material and exposing a portion of the sacrificial plug;
    selectively etching the device to remove the sacrificial plug while keeping the first and second insulating layers substantially unaltered, thereby exposing the portion of the substrate material;
    depositing a conductive layer on the device; and
    patterning the conductive layer to form a contact to the exposed portion of the substrate material.

11. The process of claim 10 wherein the step of forming a second insulating layer comprises forming a insulating layer having a substantially planar surface.

12. The process of claim 11 wherein the step of forming a second insulating layer overlying the substrate material comprises depositing SOG.

13. The process of claim 11 wherein the step of forming a second insulating layer overlying the substrate material comprises depositing an ECR glass.

14. The process of claim 10 wherein the step of depositing an imagable material comprises depositing a resist material.

15. The process of claim 10 wherein the steps of depositing an imagable material, patterning the imagable material, depositing an insulating layer, and selectively etching the device to remove the sacrificial plug are each performed at a temperature which is less than 250° C.

16. The process of claim 10 wherein the step of providing a substrate material comprises providing a silicon substrate material and the step of forming two spaced apart conductive members comprises forming two spaced apart conductive members of polysilicon.

17. A process for forming a contact in a multi-layer semiconductor device, comprising the steps of:
    providing a substrate material;
    providing spaced apart conductors overlying the substrate material;
    forming an insulating layer overlying the spaced apart conductors;
    forming a sacrificial plug overlying the insulating layer and in direct contact with a portion of the substrate material positioned between the spaced apart conductors, the sacrificial plug being of a material which has the ability to be etched selectively to the insulating layer and to the substrate material;

forming a layer of material having a substantially planar upper surface overlying the substrate material and exposing the sacrificial plug;

removing the sacrificial plug, thereby exposing the portion of the substrate material positioned between the spaced apart, conductors and forming an opening between the spaced apart conductors;

depositing a conductive layer overlying the substrate material and extending into the opening; and patterning the conductive layer to form a contact to the exposed portion of the substrate material.

18. The process of claim 17 wherein the step of providing a substrate material comprises providing a semiconductor substrate material.

19. The process of claim 17 wherein the step of forming an insulating layer overlying the spaced apart conductors comprises forming an insulating layer on selected surfaces of the spaced apart conductors.

20. The process of claim 17 wherein the step of forming a layer of material having a planarized upper surface comprises depositing a layer of material overlying the substrate material and etching the layer of material to substantially planarize an upper surface of the layer of material and to the expose the sacrificial plug.

21. The process of claim 20 wherein the step of depositing a layer of material comprises depositing an insulating layer.

* * * * *